US011828546B2

(12) United States Patent
Dietrich et al.

(10) Patent No.: US 11,828,546 B2
(45) Date of Patent: Nov. 28, 2023

(54) HEAT EXCHANGE COMPOUND MODULE

(71) Applicant: Heraeus Deutschland GmbH & Co. KG, Hanau (DE)

(72) Inventors: Peter Dietrich, Rödermark (DE); Ryan Persons, Newtown Square, PA (US)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 0 days.

(21) Appl. No.: 16/690,507

(22) Filed: Nov. 21, 2019

(65) Prior Publication Data

US 2021/0156626 A1 May 27, 2021

(51) Int. Cl.
*F28F 21/04* (2006.01)
*F28F 3/02* (2006.01)
*F28F 21/08* (2006.01)

(52) U.S. Cl.
CPC ............. *F28F 3/022* (2013.01); *F28F 21/04* (2013.01); *F28F 21/084* (2013.01); *F28F 21/085* (2013.01)

(58) Field of Classification Search
CPC .......... F28F 3/022; F28F 21/04; F28F 21/084; F28F 21/085; H01L 23/3735; B32B 15/016; B32B 9/041; B32B 15/017
See application file for complete search history.

(56) References Cited

U.S. PATENT DOCUMENTS

| | | | |
|---|---|---|---|
| 5,796,049 A | 8/1998 | Schneider | |
| 2002/0130161 A1* | 9/2002 | Schmitt | H05K 3/0061 228/124.1 |
| 2013/0193194 A1* | 8/2013 | Yang | B23K 1/206 228/262.9 |
| 2015/0085446 A1* | 3/2015 | Hable | H05K 1/021 361/719 |
| 2015/0282379 A1* | 10/2015 | Terasaki | H01L 21/4882 361/720 |
| 2017/0154855 A1* | 6/2017 | Oi | H01L 23/562 |

FOREIGN PATENT DOCUMENTS

| | | |
|---|---|---|
| EP | 2911192 A1 | 8/2015 |
| EP | 2950340 A1 | 12/2015 |
| EP | 3285292 A1 | 2/2018 |
| WO | WO-2016167218 A1 | 10/2016 |

OTHER PUBLICATIONS

European Search Report issued in EP20207430.8 dated Mar. 4, 2021.

* cited by examiner

*Primary Examiner* — Harry E Arant

(74) *Attorney, Agent, or Firm* — Blank Rome LLP

(57) ABSTRACT

The disclosure relates to a heat exchange compound module and a manufacturing method for a heat exchange compound module. The heat exchange compound module comprises a metal-ceramic substrate and a heat exchange structure. The metal-ceramic substrate comprises an outer layer of a first metallic material. The heat exchange structure is made of a second metallic material and is connected to the outer layer of the metal-ceramic substrate only by an eutectic bond between the first metallic material and the second metallic material.

19 Claims, 3 Drawing Sheets

HEAT EXCHANGE COMPOUND MODULE

FIELD OF THE INVENTION

The present disclosure relates to a heat exchange compound module and a manufacturing method for a heat exchange compound module.

BACKGROUND

Conventionally, a metal-ceramic substrate, for example a DCB (direct copper bonded), is attached to a heat sink or base plate with the aid of electroconductive glues, sinter pastes, solder or the like. This provides at least two issues. First, the use of glues, sinter pastes, solder or the like is cumbersome. Second, the massive heatsink poses problems due to its thermal mass and provides limitations in view of customization of the position, shape and size of the cooling plates.

SUMMARY

Hence, there is a need to provide an improved heat exchange compound module, which is easier to manufacture.

This objective is solved by the subject-matters of the independent claims, wherein further embodiments are incorporated in the dependent claims. It should be noted that the aspects of the disclosure described in the following apply to the heat exchange compound module as well as to the manufacturing method for a heat exchange compound module.

According to the present disclosure, a heat exchange compound module is presented. The heat exchange compound module comprises a metal-ceramic substrate and a heat exchange structure. The metal ceramic substrate comprises at least one outer layer of a first metallic material. The heat exchange structure is made of a second metallic material and is connected to the outer layer of the metal-ceramic substrate only by an eutectic bond between the first metallic material and the second metallic material.

In other words, the heat exchange structure (as e.g. a pin fin cooler) is integrated into the substrate on substrate level. The use of glues, sinter pastes, solder, thermal interface materials or the like is avoided, which makes the manufacture easier and the heat exchange compound module more reliable.

Further, the heat exchange structure can be pre-shaped and, by means of a tool, held and joined to the substrate. Thereby, the heat exchange compound module is even more easy and cost effective to manufacture.

Problems induced by the massive thermal mass of a conventionally more massive heatsink are avoided. Instead, there is an improved thermal connection between the metal-ceramic substrate and the heat exchange structure. Further, the heat exchange compound module and the heat exchange structure according to the disclosure can be easily customized in view of position, shape and size of the heat exchange structure. Furthermore, a fully integrated heat exchange compound module can be offered and sold.

The heat exchange compound module can be used for power electronic modules, especially in automotive applications for e.g. a power train using direct cooling systems. It can also be used for diodes, in particular UV diodes, comprising substrate and liquid cooled systems. Further, it can be used for all kinds of card modules with liquid cooling and in particular with water cooling.

In an embodiment, the heat exchange structure is a direct cooling device. In another embodiment, the heat exchange structure is a heat sink. In another embodiment, the heat exchange structure is a pin fin cooler. In an embodiment, the pin fin cooler comprises a plurality of single, non-interconnected pin fins. This means, the pins are not connected with each other, in particular not by means of a common holding plate. Thereby, issues induced by the larger thermal mass of a conventional heatsink comprising not only the pins, but also a common plate holding the pins are avoided. Further, the heat exchange structure can be manufactured easier and more cost effective compared to a conventional pin fin cooler.

In an embodiment, the heat exchange structure is directly connected to the outer layer of the metal-ceramic substrate, which means without any agent. In an embodiment, the heat exchange structure is connected to the outer layer of the metal-ceramic substrate by a heat diffusion process.

In an embodiment, the metal-ceramic substrate is a sandwich comprising the outer layer of the first metallic material as a first outer layer, followed by a metal-ceramic core and followed by another or second outer layer of a metallic material. It may be the same or a different metallic material compared to the first metallic material. The other or second outer layer may be at least partly structured to form electrical contact areas. The electrical contact areas can be used to connect the heat exchange compound module to an electronic unit.

The metal-ceramic substrate may have a thickness in a range of 0.75 to 1.1 mm, preferably 0.9 to 1.0 mm, and more preferably 0.92 to 0.98 mm. This can be understood as, for example, two layers of metallic material of about 0.3 mm and a ceramic of about 0.32 to 0.38 mm. Further thicknesses are also feasible, for example, 0.65 to 2.20 mm in total, which can be two layers of metallic material of about 0.2 to 0.6 mm and 0.25 to 1 mm ceramic.

The ceramic may be or comprise $Al_2O_3$, $Si_3N_4$ or AlN.

In an embodiment, the first metallic material is aluminum or copper or another bulk metal or alloy. In an embodiment, the first metallic material comprises aluminum or copper or another bulk metal or alloy as major component. "As major component" can herein be understood as comprising the stated element and only minor amounts of other elements or traces or additives. For example, the first metallic material comprises 80 to 99.9% aluminum or copper, and preferably 95 to 99.9% aluminum or copper. The first metallic material might be copper bonded to the ceramic in a DCB process or bonded using a brazing material.

In an embodiment, the second metallic material is aluminum or comprises aluminum as major component. For example, the second metallic material comprises 50 to 99.9% aluminum, preferably 75 to 99.9% aluminum, and more preferably 95 to 99.9% aluminum.

The eutectic bond can be understood as a bonding by means of a metallic material layer (herein the second metallic material) that can produce an eutectic system (herein with the first metallic material). The so-called eutectic metallic material can transform directly from solid to liquid state or vice versa from liquid to solid state, at a specific composition and eutectic temperature without passing a two-phase equilibrium, i.e. liquid and solid state. The eutectic system is a homogeneous mixture of substances that melts or solidifies at a single eutectic temperature that might be lower than the melting point of the constituents. The eutectic temperature can be understood as the lowest possible melting temperature compared to the melting temperature of all the different mixing ratios for the constituents. In an embodiment, the eutectic temperature is in a range of 530° C. to 570° C., preferably 540° C. to 560° C. It may be 550° C. or 548° C. During the eutectic temperature, the first material (e.g. Cu) and the second material (e.g. Al) form an eutectic bond between the substrate and the heat exchange structure.

According to the present disclosure, also a manufacturing method for a heat exchange compound module is presented. The manufacturing method for a heat exchange compound module comprises the following steps:

provide a metal-ceramic substrate comprising an outer layer of a first metallic material, applying a heat exchange structure made of a second metallic material on the metal-ceramic substrate to form a heat exchange compound module, and heating the heat exchange compound module to an eutectic temperature, at which the heat exchange structure connects to the outer layer of the heat exchange substrate (the metallic material of the metal-ceramic substrate) only by an eutectic bond between the first metallic material and the second metallic material.

In an embodiment, the heat exchange structure is a direct cooling device. In an embodiment, the heat exchange structure is a pin fin cooler or a heat sink.

In an embodiment, the first metallic material is or comprises aluminum or copper or another bulk metal or alloy as major component. In an embodiment, the second metallic material is or comprises aluminum or the like as major component.

In an embodiment, the eutectic temperature is in a range of 530° C. to 570° C., preferably 540° C. to 560° C. It may be 550° C. or 548° C. During the eutectic temperature, the first material (e.g. Cu) and the second material (e.g. Al) form an eutectic bond between the substrate and the heat exchange structure.

In an embodiment, the heating is done in an inert atmosphere as e.g. nitrogen.

In an embodiment, the heat exchange compound module further comprises a step of applying a weight on the heat exchange compound module before heating the heat exchange compound module. The weight might be up to 0.5 kg equally distributed on the entire metal-ceramic substrate (either being a master card (5×7 inches) or a single unit). As material of the weight any material being stable up to the eutectic temperature might be used, e.g. ceramic or steel.

It shall be understood that the module and the method according to the independent claims have similar and/or identical preferred embodiments, in particular, as defined in the dependent claims. It shall be understood further that a preferred embodiment of the disclosure can also be any combination of the dependent claims with the respective independent claim.

These and other aspects of the present disclosure will become apparent from and be elucidated with reference to the embodiments described hereinafter.

BRIEF DESCRIPTION OF THE DRAWINGS

Exemplary embodiments of the disclosure will be described in the following with reference to the accompanying drawing.

DETAILED DESCRIPTION OF EMBODIMENTS

Figure 1:
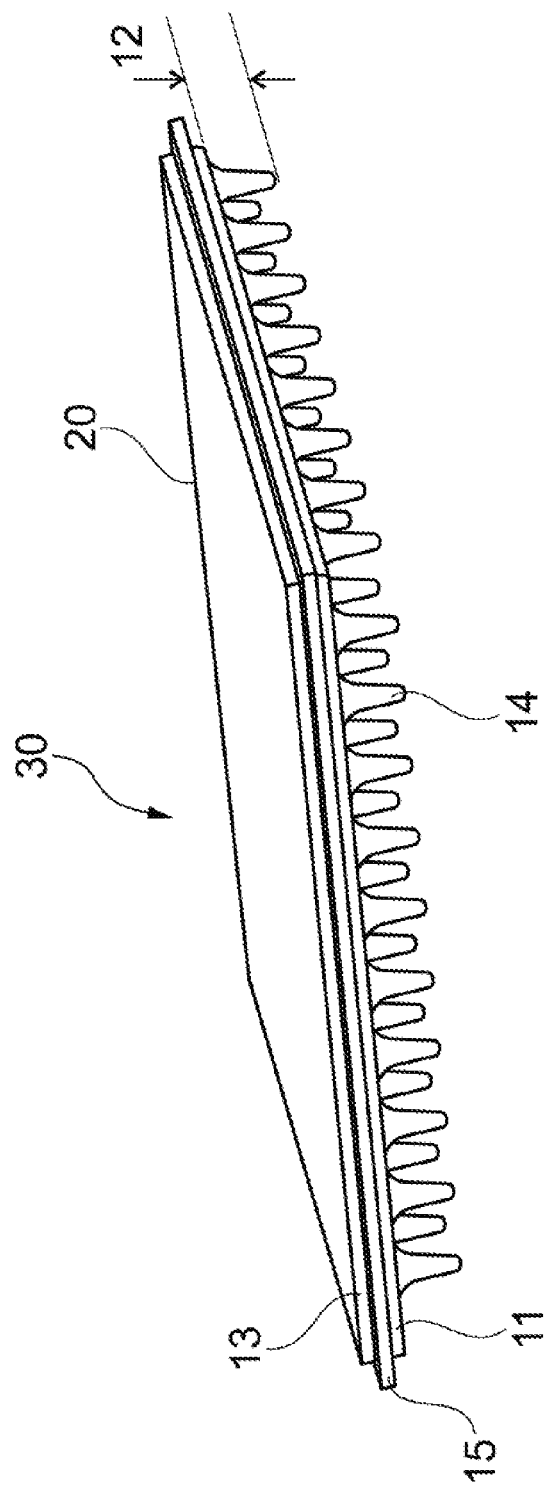
FIG. 1 shows schematically and exemplarily an embodiment of a heat exchange compound module.

FIG. 1 shows schematically and exemplarily an embodiment of a heat exchange compound 30 module.

The heat exchange compound module 30 comprises a metal-ceramic substrate 20 and a heat exchange structure 12. The heat exchange structure 12 is a pin fin cooler and comprises a plurality of single, non-interconnected pin fins 14.

The metal-ceramic substrate 20 comprises an outer layer 11 of a first metallic material. The first metallic material is e.g. aluminum or copper. The metal-ceramic substrate 20 is a sandwich comprising the outer layer 11 of the first metallic material as a first outer layer, followed by a ceramic core 15 and followed by a second outer layer 13 of a metallic material. The metallic material of the second outer layer 13 may be the same or a different metallic material compared to the first metallic material. The second outer layer may be structured to form electrical contact areas to be connected to an electronic unit.

The heat exchange structure 12 is made of a second metallic material and is connected to the first metallic material of the outer layer 11 of the metal-ceramic substrate 20 only by an eutectic bond between the first metallic material and the second metallic material. This means the heat exchange structure 12 is directly connected to the outer layer of the metal-ceramic substrate without any agent. The second metallic material is e.g. aluminum.

Figure 2:
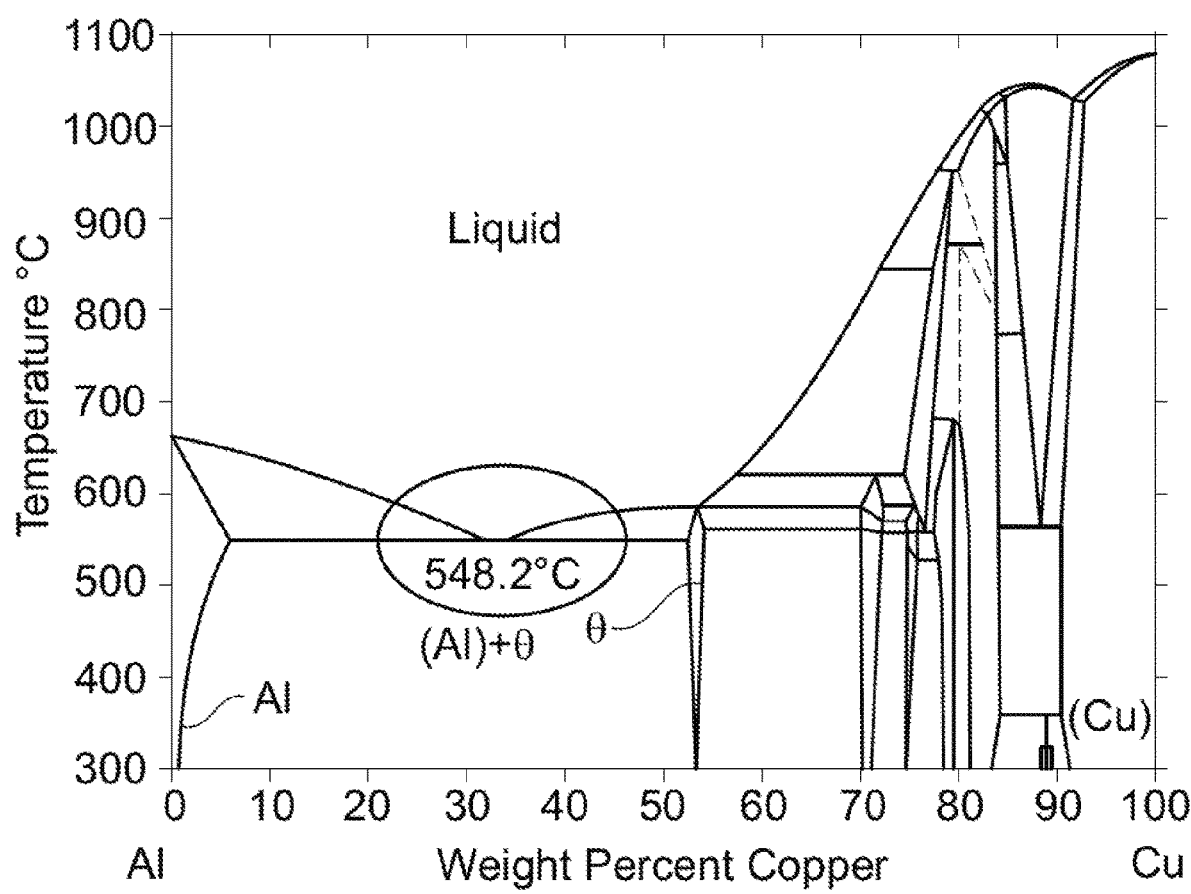
FIG. 2 shows schematically and exemplarily the phase diagram of aluminum and copper.

As shown in the phase diagram of FIG. 2, the eutectic point or temperature of aluminum and copper (marked by a circle) is at 548.2° C., roughly at 548° C. During the eutectic temperature, the first material (e.g. Cu) and the second material (e.g. Al) form an eutectic bond between the substrate and the heat exchange structure.

Figure 3:
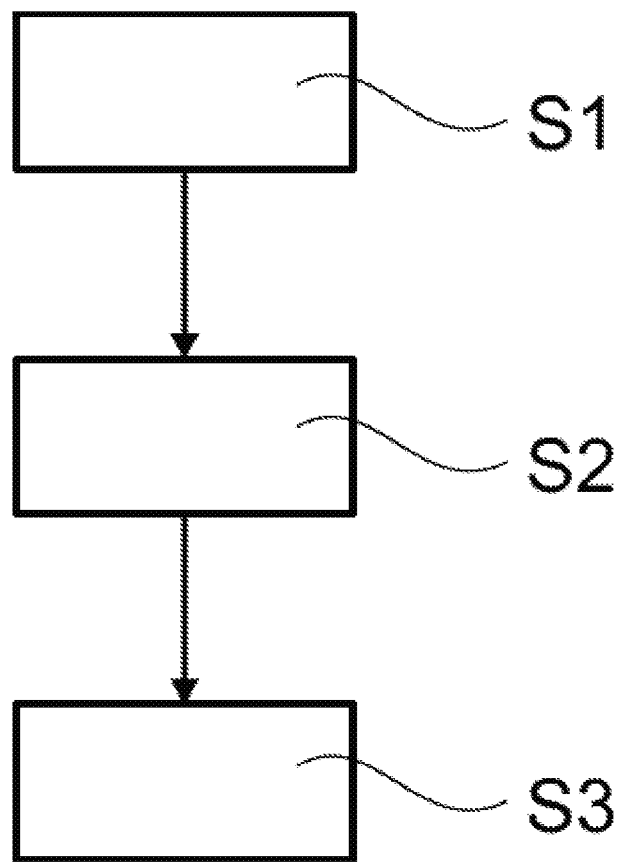
FIG. 3 shows schematically and exemplarily an embodiment of a manufacturing method for a heat exchange compound module.

FIG. 3 shows schematically and exemplarily an embodiment of a manufacturing method for a heat exchange compound module. It comprises the following steps, not necessarily in this order:

In step S1, providing a metal-ceramic substrate comprising an outer layer of a first metallic material, In step S2, applying a heat exchange structure made of a second metallic material on the metal-ceramic substrate to form a heat exchange compound module, and In step S3, heating the heat exchange compound module to an eutectic temperature, at which the heat exchange structure connects to the outer layer of the heat exchange substrate only by an eutectic bond between the first metallic material and the second metallic material.

The heating can be done in a nitrogen furnace at e.g. 560° C.

It has to be noted that embodiments are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and foregoing description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage.

What is claimed is:

1. A heat exchange compound module, comprising:
   a metal-ceramic substrate comprising an outer layer of a first metallic material, and
   a heat exchange structure made of a second metallic material, the second metallic material comprising 95 to 99.99% aluminum,
   wherein the heat exchange structure is connected to the outer layer of the metal-ceramic substrate only by a eutectic bond between the first metallic material and the second metallic material, and wherein the eutectic bond consists of a homogeneous mixture of the first metallic material and the second metallic material.

2. The module of claim 1, wherein the heat exchange structure is a direct cooling device.

3. The module of claim 1, wherein the heat exchange structure is a pin fin cooler.

4. The module of claim 3, wherein the pin fin cooler comprises a plurality of single, non-interconnected pin fins.

5. The module of claim 1, wherein the heat exchange structure is a heat sink.

6. The module of claim 1, wherein the heat exchange structure is connected to the outer layer of the metal-ceramic substrate by a heat diffusion process.

7. The module of claim 1, wherein the first metallic material comprises copper as major component.

8. The module of claim 1, wherein the metal-ceramic substrate is a sandwich comprising the outer layer of the first metallic material as a first outer layer, followed by a ceramic core and followed by a second outer layer of a metallic material.

9. The module of claim 1, wherein the metal-ceramic substrate comprises another outer layer of a metallic material, wherein the another outer layer is at least partly structured to form electrical contact areas.

10. The module of claim 1, wherein the first metallic material comprises 80 to 99.9% copper.

11. A manufacturing method for a heat exchange compound module, comprising the following steps:
    providing a metal-ceramic substrate comprising an outer layer of a first metallic material, applying a heat exchange structure made of a second metallic material on the metal-ceramic substrate to form a heat exchange compound module, the second metallic material comprising 95 to 99.9% aluminum, and
    heating the heat exchange compound module to a eutectic temperature of the first metallic material and the second metallic material, at which the heat exchange structure connects to the outer layer of the metal-ceramic substrate only by a eutectic bond between the first metallic material and the second metallic material, wherein the eutectic bond consists of a homogeneous mixture of the first metallic material and the second metallic material.

12. The method of claim 11, wherein the first metallic material comprises copper as a major component.

13. The method of claim 11, wherein the eutectic temperature is in a range of 530° C. to 570° C.

14. The method of claim 11, wherein the heating is done in an inert atmosphere.

15. The method of claim 11, further comprising a step of applying a weight on the heat exchange compound module before heating the heat exchange compound module.

16. The method of claim 11, wherein the heat exchange structure is a direct cooling device.

17. The method of claim 11, wherein the heat exchange structure is a pin fin cooler.

18. The method of claim 11, wherein the heat exchange structure is a heat sink.

19. The method of claim 11, wherein the first metallic material comprises 80 to 99.9% copper.

* * * * *